Aug. 4, 1970
R. C. HEUNER ETAL
TEMPERATURE TRACKING OF EMITTER COUPLED
DIFFERENTIAL AMPLIFIER STAGE
Filed May 3, 1968
3,522,548

INVENTOR
ROBERT C. HEUNER &
IRWIN OSTROFF
BY H. Christoffersen
ATTORNEY

United States Patent Office 3,522,548

Patented Aug. 4, 1970

3,522,548

TEMPERATURE TRACKING OF EMITTER COUPLED DIFFERENTIAL AMPLIFIER STAGE

Robert C. Heuner, Bound Brook, and Irwin Ostroff, North Plainfield, N.J., assignors to RCA Corporation, a corporation of Delaware Filed May 3, 1968, Ser. No. 726,323
Int. Cl. H03f 1/32
U.S. Cl. 330—23 7 Claims

ABSTRACT OF THE DISCLOSURE

Disclosed herein is an emitter coupled differential amplifier stage wherein a parallel combination of a current generator means and a common emitter resistor is connected in the emitter circuit. The combination provides temperature compensation by maintaining the current in the differential stage constant over the operating range of temperature and also increases the frequency stability of the amplifier stage.

BACKGROUND OF THE INVENTION

The use of a differential amplifier stage with either a transistor current sink or with a common emitter resistor is known in the art. The constant current sink provides the high impedance necessary for good common mode rejection, and moreover behaves as a substantially constant current generator virtually insensitive to power supply variations. The circuit, however, is highly susceptible to temperature changes due to the temperature dependence of the forward biased base-to-emitter junction. In addition, the high emitter impedance which is so desirable in one respect, presents a problem at high frequencies for it renders the circuit unstable as evidence by oscillations in the amplifier stage. The disadvantage of using a common emitter resistor is that the current flowing through the emitter resistor, is a function of the supply voltage and varies in direct proportion thereto. Also, in order to achieve a high input impedance, the emitter resistor has to be made large, and in order to maintain a minimum current level in the amplifier stage, a higher value of supply voltage must be used. Thus, the common emitter resistance circuit is voltage sensitive and is inefficient since it consumes more power than alternate methods. It is an object of this invention to present a circuit which minimizes the disadvantages enumerated above and which achieves cancellation of the temperature dependent parameters.

BRIEF SUMMARY OF THE INVENTION

In an emitter coupled differential amplifier stage, the emitter circuit consists of the parallel combination of a substantially constant current sink and a common emitter resistor. The combination provides temperature compensation by keeping the differential amplifier current constant despite changes in temperature. In addition, the differential amplifier stage embodying the invention, exhibits the advantageous characteristics of the constant current sink and and of the common emitter resistor, as evidenced by its diminished dependence on supply voltage variations, and its increased stability over a wide frequency range.

In logic gate circuits embodying the invention, the noise margin is kept constant, making the circuit more suitable for operation over a wide range of temperature and supply voltage.

DETAILED DESCRIPTION

Figure 1:
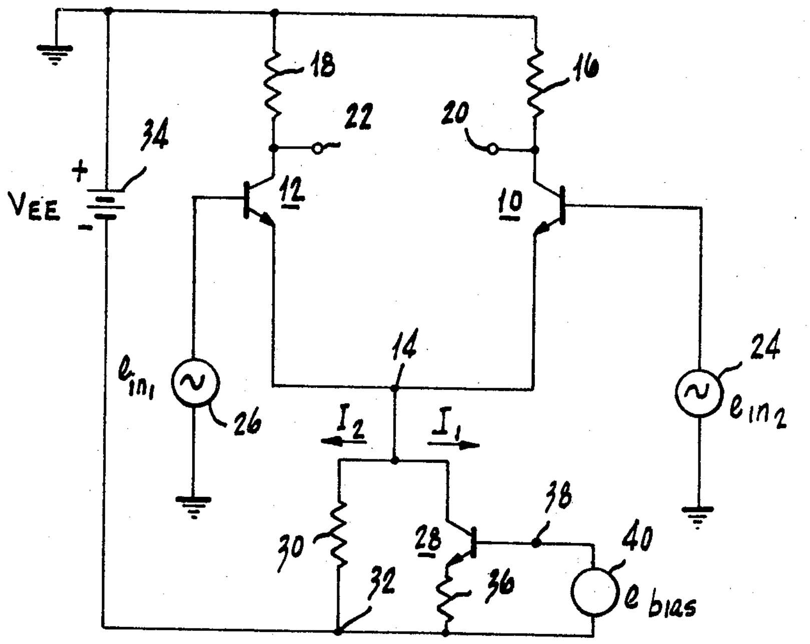
FIG. 1 is a schematic diagram of an emitter coupled differential amplifier stage embodying the invention.

The emitter coupled differential amplifier stage is widely used in amplifier circuits, particularly in operational amplifiers and in high speed current steering logic gate circuits where direct coupling of the stages is desirable and necessary. This mode of operation, however, imposes severe limitations on the permissible drift of the output voltage levels of the amplifier stage.

The output voltage level is determined by the voltage drop across the load resistor. This voltage drop is directly proportional to the value of collector current ($I_C$) flowing in the load resistor. Obviously, any change in collector current produces a change in output voltage. Thus, any drift or change in collector current due to whatever cause is equivalent to an erroneous signal input.

In a logic gate circuit, collector current variations causing a shift in the logic levels may decrease the noise immunity to the point that the logic gate becomes susceptible to triggering by low level noise pulses. If the variation is large enough, it may result in the presentation of a logic "1" rather than a logic "0" (or vice versa) and thereby cause false triggering.

Control of the collector current is achieved, according to the invention, by the parallel combination of a current generator and a common emitter resistor connected in the emitter circuit of the differential amplifier stage. As the temperature increases, an increasing current through the common emitter resistor is used to compensate for a decrease in current flowing through the current gnerator. The problem and its solution is best illustrated by referring to FIG. 1. The emitter coupled differential amplifier stage shown in FIG. 1 includes a first transistor 10 of one conductivity type, illustrated as NPN type, connected in a first circuit branch, and a second transistor 12 of the same conductivity type connected in parallel in a second circuit branch. Transistors 10 and 12 have their emitters connected in common to junction point 14. Transistor 10 has its collector connected to resistor 16 and transistor 12 has its collector connected to resistor 18, the other end of resistors 12 and 18 being connected to a point of substantially fixed voltage, illustrated in the drawing by the conventional symbol for circuit ground. Output terminals 20 and 22 permit connections of additional circuitry to the differential amplifier. The bases of transistors 10 and 12 are connected respectively to signal sources 24 and 26. The signal sources may be independent of each other or one may be a reference source and the other one may be variable. The common junction point 14 is connected to the collector of transistor 28 and one end of resistor 30. The other end of resistor 30 is connected to the negative terminal 32 of a suitable source 34 of potential. One end of resistor 36 is connected to terminal 32 and the other end is connected to the emitter of transistor 28. The base 38 of transistor 28 is connected to a point of relatively fixed potential provided by the source of bias voltage 40. One method for obtaining the bias voltage which is especially applicable in integrated circuits is shown in FIG. 2 wherein the fixed bias is obtained by means of diodes 52 and 54, which are connected to supplying resistor 56, which in turn is connected to ground potential.

Operation of the differential stage is well-known and only the salient points affecting the present invention will be discussed.

The current flowing in transistors 10 and 12 is essentially determined by the emitter circuit, which consists of current sink transistor 28 and common emitter resistor 30. Assuming transistors 10 and 12 to have relatively high current gains ($B \geq 50$), the simplifying assumption may be made that the collector current is equal to the emitter current. The net emitter current ($I_e$) obtained from either or both transistors 10 and 12 then flows into the common emitter circuitry which contains two current paths. A first current ($I_1$) flows into the current sink circuit along a conduction path consisting of the collector-to-emitter junction of transistor 28 and resistor 36. This first current $I_1$ is virtually independent of variations in supply voltage, being determined by a value of the bias voltage ($e_b$) applied to the base of transistor 28 minus the base-to-emitter ($V_{BE}$) drop of transistor 28 divided by the value of resistance 36, and may be expressed as follows:

$$\left[I_1=\frac{e_b-V_{BE}}{R_3}\right]$$

A second current ($I_2$) flows through the common emitter resistor 30. This current, $I_2$, is determined by the potential existing between junction point 14, which is the common emitter voltage of the amplifier stage, and function point 32, which is the negative terminal of the source of potential 34 and which is maintained at a value of $-V_{EE}$. The voltage at junction point 14 will always equal the highest value of input voltage ($e_{in}$) minus the forward base-to-emitter voltage drop ($V_{BE}$) of either or both transistors 10 and 12. $I_2$ is therefore a function of the input voltage, the power supply voltage, the $V_{BE}$ drop (of either or both differential transistors) and the value of resistor 30 and may be expressed as follows:

$$\left[I_2=\frac{V_{EE}+e_{in}-V_{BE}}{R_{30}}\right]$$

As previously stated, the sum of $I_1$ and $I_2$ is equal to the emitter current, which in turn represents the current flowing in the collectors of transistors 10 and/or 12. Reviewing the expression for $I_1$ and $I_2$, it is noticed that both contain a term representing a forward biased base-to-emitter junction ($V_{BE}$). The base-to-emitter voltage $V_{BE}$ is both temperature and current level dependent. Moreover, the temperature coefficient of the $V_{BE}$ temperature variation is current level dependent. For example, for a certain transistor geometry, it has been found that the temperature coefficient of $V_{BE}$ changes from −1.6 millivolts per ° C. at low emitter currents (0.1 milliamperes or less) to −1.3 millivolts per ° C. at 5 milliamperes of emitter current.

Where the bias votlage ($e_b$) for the current sink circuit is derived, as in many integrated circuit applications, from two transistors connected as diodes (by shorting the base to the collector or by just floating the collector and using only the base-to-emitter junctions), as in FIG. 2, the value of the bias voltage is the sum of each of the $V_{BE}$ drops. In the instance described $e_b$ would equal two $V_{BE}$ drops ($e_b=2V_{BE}$). Substituting this value of $e_b$ into the equation for $I_1$, it is seen that the first current $I_1$ equals one $V_{BE}$ drop divided by the value of resistor 36

$$(I_1=V_{BE/R_{36}})$$

Since $V_{BE}$ has a negative temperature coefficient, $I_1$ decreases with temperature rise. Examining the equation for $I_2$, it is seen that an increase in temperature causes $V_{BE}$ to decrease resulting in a net increase in the potential across fixed resistor $R_{30}$ and, therefore, in an increase in $I_2$. Nearly perfect balance may be achieved by the proper selection of the raio of $R_{30}$ and $R_{36}$. Temperature compensation is thus effected without the use of special materials. This method lends itself especially to the art of integrated circuitry but is not limited thereto.

Figure 3:
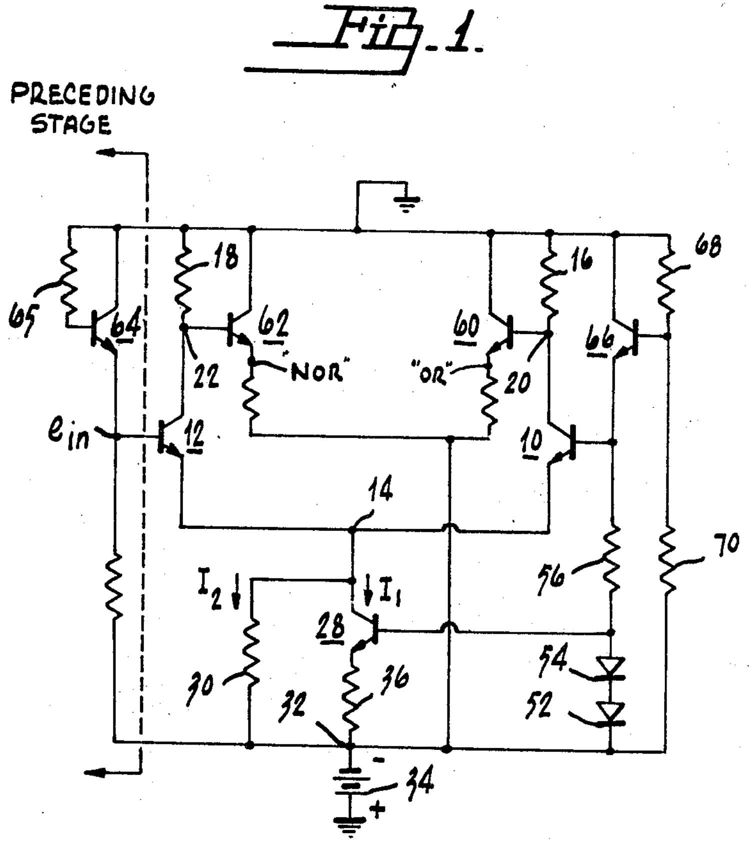
FIG. 3 is a schematic drawing of an emitter coupled current steering logic gate embodying the invention.

FIG. 3 depicts another embodiment of the invention wherein the differential stage is part of a current steering logic gate. The output terminals 20, 22 of the differential amplifiers are connected, respectively, to the bases of the emitter follower transistors 60 and 62. The emitter follower outputs provide the "NOR" and "OR" signal used to drive subsequent gates. Transistor 64 whose base is connected to ground potential through resistor 65, is the emitter follower output of a preceding stage and is shown connected to the base of transistor 12. Assume that the output of this transistor is a high level or logic "1" signal. The base of transistor 10 is connected to the emitter of transistor 66, which provides the reference level for the differential stage and acts as the power source for the current sink bias circuitry represented by resistor 56 and diods (transistors with base-to-collector short) 52 and 54. The base of transistor 66 is connected to the voltage divider circuit comprising resistors 68 and 70. It is the ratio of these two resistors which sets the desired reference level.

Analysis of the circuit reveals that the voltage level at the common emitter (junction point 14), of transistors 10 and 12 will have either one of two values. The first value, obtained when the output of the preceding stage is "Hi," is approximately equal to ground potential minus the sum of the forward voltage drops of the base-to-emitter junctions of transistors 64 and 12. The second value, obtained when the output of the preceding stage is "Lo," is approximately equal to the reference voltage established by resistors 68 and 70 minus the sum of the forward voltage drops of the base-to-emitter junction of transistors 66 and 10. Thus the voltage at junction point 14 is always two (2) $V_{BE}$ drops below either ground potential or the reference established by resistors 68 and 70. Therefore, as discussed above, the voltage at junction point 14 will rise with an increase in temperature at twice the rate set by the negative temperature coefficient of a single base-to-emitter junction. Assuming, for tutorial purposes only, a negative temperature coefficient of 1.6 millivolts per ° C., junction point 14 will rise by 3.2 millivolts per ° C., resulting in an increase in the current $I_2$ through the common emitter resistor 30 of $$\frac{3.2}{R_{30}}\left(\frac{\text{milliamps}}{°\text{C.}}\right)^2$$

Figure 2:
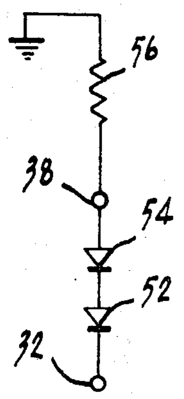
FIG. 2 is a schematic diagram of a type of biasing network for a transistor current sink.

The current generator circuit is identical to the one presented by combining FIGS. 1 and 2, and as above, the decrease in potential across resistor 36 will be at the rate of 1.6 millivolts per ° C. resulting in a decrease in current ($I_1$) at the rate of $$\frac{1.6}{R_{36}}\left(\frac{\text{milliamps}}{°\text{C.}}\right)$$

The decreasing current rate in the first current path can be nulled out by the increasing current rate in the second current path by the proper choice of resistance ratios. Though the example propounded indicates that $R_{30}$ should be selected twice as large as $R_{36}$, laboratory experiments show that due to secondary effects such as the variation of the temperature coefficient of the forward biased base-to-emitter junction with current level, a ratio other than two to one (2:1) may be required for optimum nulling. For example, in one particular circuit embodying the invention, a ratio of three to one (3:1) gave optimum nulling.

By splitting the emitter currents equally between the two conduction paths established by the common emitter resistor and the constant current sink, near perfect temperature tracking is obtained. This results in maintaining a constant noise margin over the full temperature variations.

The transistor current sink is biased to make the current flowing through it independent of power supply variations. Thus, the emitter current, when split equally between $I_1$ and $I_2$, becomes one half as sensitive to power supply regulation when compared to a circuit consisting solely of a common emitter resistor.

Using only a high impedance current source has a detrimental effect on the circuit stability. Due to lead inductance (in the base circuit of the differential amplifier) and to shunt capacitance at the emitter junction of the differential pair, an effective LC circuit is present which may cause the amplifier stage to oscillate. Decreasing the output impedance of the current source by means of the common emitter resistor acts to shunt the capacitance and dampen the circuit extending the frequency stability range.

The use of a common emitter resistor in parallel with a transistor current sink has been shown to provide temperature compensation, power supply insensitivity and, frequency stability. The transistor current sink has been used to illustrate the invention because it is highly suitable for integrated circuitry. But note, that any temperature sensitive current generator connected in the emitter circuit of the differential stage can be shunted by a common emitter resistor to achieve the same or similar results.

Use of the emitter resistor may be further extended by connecting the differential stage emitter resistor 30 across the collector-to-emitter junction of the current sink transistor 28 and using resistor 36 as a common return for both current paths. Such an arrangement, although poorer in temperature tracking, enhances the insensitivity to power supply variations and input "1" level noise and decreases susceptibility to oscillations. In addition, it allows the two resistors to be made much smaller without increasing the power dissipation which is a very desirable end goal in integrated circuitry.

Although the circuits described shown NPN-type transistors, it will be apparent to those skilled in the art that the circuit will function with a PNP-type transistor provided that the connections to the potential source are reversed.

What is claimed is:

1. The combination comprising:
first and second transistors of one conductivity type each having a base, a collector and an emitter;
means for connecting the base of the first transistor to a first source of signal;
means for connecting the base of the second transistor to a second source of signal;
first and second junction points;
means connecting the emitters of said first and second transistors to said first junction point;
a substantially constant current generating means providing a first conduction path for the emitter current of said first and second transistors connected between said first junction point and said second junction point;
a resistor providing a second conduction path for the emitter current of said first and second transistors connected at one end to said first junction point; and
means for connecting the collectors of said first and second transistors, said second junction point, and the other end of said resistor to points of suitable operating potential.

2. The combination as claimed in claim 1, wherein said substantially constant current generating means includes a third impedance means and a third transistor having a base, a collector and an emitter, wherein the collector of said third transistor is connected to said first junction point, the emitter of said third transistor is connected to said second point by said third impedance means, and means for connecting the base of said third transistor to a source of potential having a value to forward bias the emitter-base junction of said third transistor.

3. The combination as claimed in claim 2, wherein the first, second and third transistors are of the same conductivity type.

4. The combination as claimed in claim 2, wherein said first source of signal produces a relatively fixed potential; and
wherein said second source of signal is a signal source applying input signals having either a first value which is greater than said fixed potential or a second value which is less than said fixed potential.

5. The combination as claimed in claim 1, wherein said substantially constant current generating means provides a first conduction path and said resistor provides a second conduction path for the emitter current for said first and second transistors, and wherein the conduction of said first conduction path is temperature dependent causing the current therein to vary with a first polarity, and
wherein the current level in said second conduction path is also temperature dependent causing the current therein to vary with a second polarity opposite to said first polarity.

6. In a circuit which includes first and second junction points and means for applying a voltage across said points, a circuit for insuring that the current passing from one such junction point to the other does not appreciably change in response to temperature variations, comprising:
a substantially constant current generating means directly connected between said first and second junction points providing a first conduction path whose conduction varies in one sense with temperature; and
means including a first resistor connected between said first and second junction points providing a second conduction path whose conduction varies in the opposite sense with temperature.

7. The combination as claimed in claim 6, wherein said substantially constant current generating means includes a second resistor and a transistor having a base, an emitter and a collector, said base being connected to a point of substantially fixed potential, said second resistor being connected between said emitter and said second junction point and said collector being connected to the first junction point;
wherein the second conduction path providing means is connected between said first junction point and one of the ends of said second resistor.

References Cited

UNITED STATES PATENTS 3,290,520 12/1966 Wennik ---------- 330—30 X

ROY LAKE, Primary Examiner

L. J. DAHL, Assistant Examiner

U.S. Cl. X.R.

330—30